United States Patent [19]
Shigemoto

[11] Patent Number: 5,923,570
[45] Date of Patent: Jul. 13, 1999

[54] CLOCK WIRING DESIGN METHOD FOR INTEGRATED CIRCUIT

[75] Inventor: Masatsugu Shigemoto, Hamamatsu, Japan

[73] Assignee: Yamaha Corporation, Hamamatsu, Japan

[21] Appl. No.: 08/753,252

[22] Filed: Nov. 21, 1996

[30] Foreign Application Priority Data

Dec. 22, 1995 [JP] Japan ................................ 7-350195

[51] Int. Cl.⁶ .................................................. G06F 17/50
[52] U.S. Cl. ......................... 364/491; 364/489; 364/490
[58] Field of Search .................................. 364/488–491

[56] References Cited

U.S. PATENT DOCUMENTS

| | | | |
|---|---|---|---|
| 5,339,253 | 8/1994 | Carrig et al. | 364/489 |
| 5,557,779 | 9/1996 | Minami | 395/500 |
| 5,638,291 | 6/1997 | Li et al. | 364/490 |
| 5,754,826 | 5/1998 | Gamal et al. | 395/500 |
| 5,774,371 | 6/1998 | Kawakami | 364/491 |

OTHER PUBLICATIONS

Chung et al. ("Optimal buffered clock tree synthesis", IEEE, Proceedings of the Seventh Annual IEEE International ASIC Conference and Exhibit, Sep. 19, 1993, pp. 130–133).

Menezes et al. ("Skew reduction in clock trees using wire width optimization", IEEE, Proceedings of IEEE Custom Integrated Circuits Conference –CICC '93, May 9, 1993, pp. 9.6.1–4).

Pullela et al. ("Skew and Delay Optimization For Reliable Buffered Clock Trees", IEEE Comput. Soc. Press, Proceedings of 1993 International Conference on Computer Aided Design, Nov. 7, 1993, pp. 556–562).

*Primary Examiner*—Kevin J. Teska
*Assistant Examiner*—Phallaka Kik
*Attorney, Agent, or Firm*—Loeb & Loeb LLP

[57] ABSTRACT

In a gate array type automatic wiring design, after arranging macrocells necessary for forming an integrated circuit, the wiring operation for clock wires 16, 18a to 18c is performed for macrocells $A_1$, $A_2$, $B_1$ to $B_3$, $C_1$, $C_2$ that are sequence circuits such as flip-flop circuits. After wiring parameters such as clock wire width and route as well as clock buffer connecting position have been determined based on these wiring data of the clock wires, the re-wiring operation for the clock wires 16, 18a to 18c and the arranging operation for a clock driver 12 and clock buffers 14, 20a to 20c are performed. The macrocell re-arranging operation and the wiring operation between the macrocells are thereafter performed. Such wiring design is applicable to standard cell type automatic wiring systems.

7 Claims, 3 Drawing Sheets

CLOCK WIRING DESIGN METHOD FOR INTEGRATED CIRCUIT

BACKGROUND OF THE INVENTION

The present invention relates to a clock wiring design method for integrated circuits such as LSIs. More specifically, the invention is directed to a method implementing a wiring design suited for a specific sequence circuit cell arrangement by re-wiring clock wires and arranging clock buffers while determining wiring parameters based on the wiring data of the clock wires.

RELATED ART

The following gate array type automatic arranging/wiring design method has heretofore been known. The method involves the steps of: reading circuit cells (also called "macrocells") necessary for forming a desired integrated circuit from a library in which a group of circuit cells including sequence circuits such as flip-flop circuits are registered; and arranging the read circuit cells in a region corresponding to a surface of a semiconductor chip indicated on a screen of, e.g., a display.

In the operation of wiring between circuit cells, the wiring operation for clock wires is performed through a predetermined pattern so that clock signals can be distributed evenly within the chip. FIG. 4 shows an exemplary clock wiring pattern called "a clock tree" with reference to a semiconductor chip 1. In FIG. 4, reference numeral 2 denotes a clock driver; 3, 6a to 6f, clock buffers; 4, a main clock wire; and 5a to 5f, branch cock wires. The wiring operation for the clock tree is performed either automatically or manually in the region where the circuit cells are arranged.

Generally, it is rare that sequence circuit cells such as flip-flop circuits are evenly distributed within the chip; the sequence circuit cells are often arranged abundantly on one region and sparsely on the other.

In the aforementioned clock wiring design method, appropriate wiring width and wiring route cannot be determined by taking into consideration the abundance and sparseness in sequence circuit cell arrangement. As a result, there has been addressed the following shortcomings: the wiring width is too narrow in the region where the sequence circuit cells concentrate; the clock wires and clock buffers are wasted in the region where the sequence circuit cells are sparsely arranged; and phase shift (clock skew) due to variations in the delay time of clock signals is caused between the region where the sequence circuit cells are abundantly arranged and the region where the sequence circuit cells are sparsely arranged.

SUMMARY OF THE INVENTION

An object of the invention is to provide a novel clock wiring design method for an integrated circuit that enables a wiring design suited for a sequence circuit cell arrangement to be implemented.

To achieve the above object, the invention is applied to a clock wiring design method for an integrated circuit, which involves the steps of:

reading circuit cells necessary for forming a desired integrated circuit from a library in which a group of circuit cells including sequence circuit cells are registered and arranging the read circuit cells in a region corresponding to a surface of a semiconductor chip;

performing a wiring operation for the circuit cells arranged in the region;

determining wiring parameters for clock wires and clock buffers based on wiring data of the clock wires; and performing a re-wiring operation for the clock wires and an arranging operation for the clock buffers in accordance with the wiring parameters determined in the preceding step.

According to the method of the invention, wiring parameters such as the clock wire width and route and clock buffer connection position are determined based on the wiring data of the clock wires, and the clock wires are re-wired and the clock buffers are arranged in accordance with these wiring parameters. Therefore, a wiring design suited for a specific sequence circuit cell arrangement can be implemented. For example, in a region where the sequence circuit cells are arranged heavily, the number of clock wires as well as the number of clock buffers can be increased, or the clock wiring width can be increased.

DESCRIPTION OF THE PREFERRED EMBODIMENTS

Figure 1:
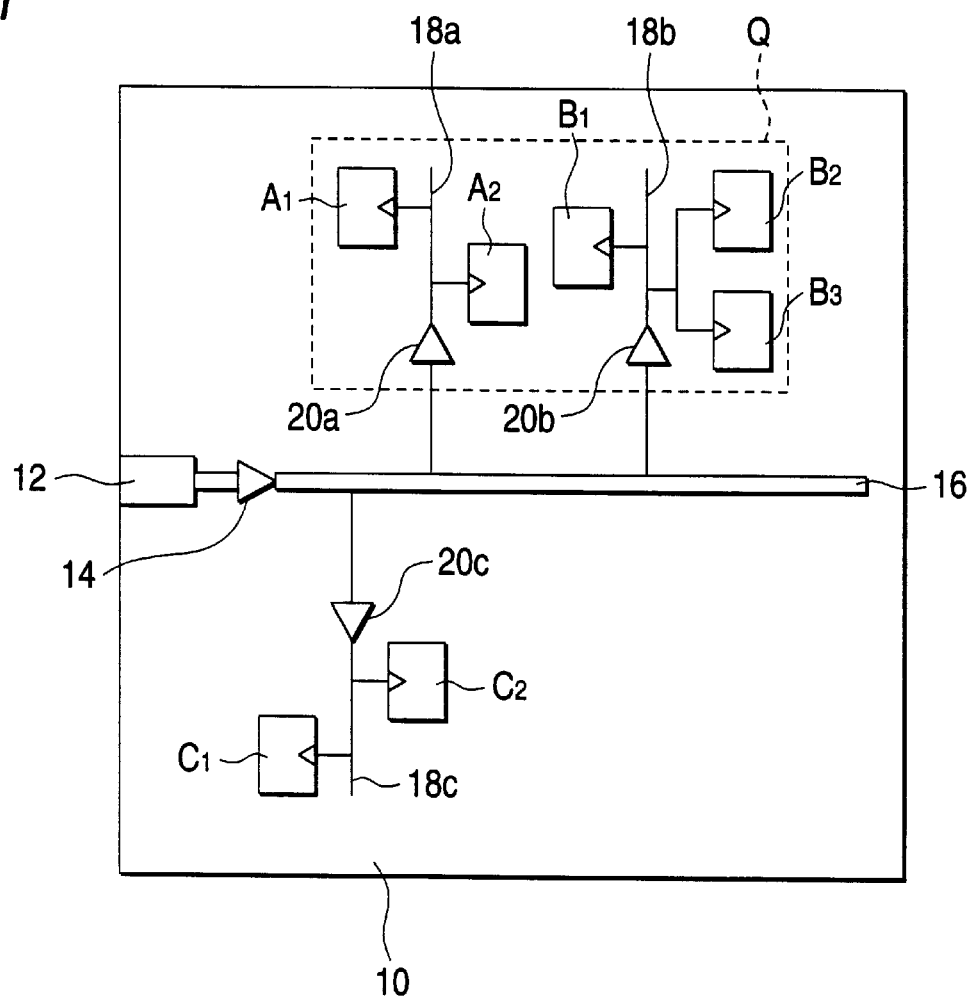
FIG. 1 is a plan view showing a wiring condition of clock wires in the invention.
Figure 2:
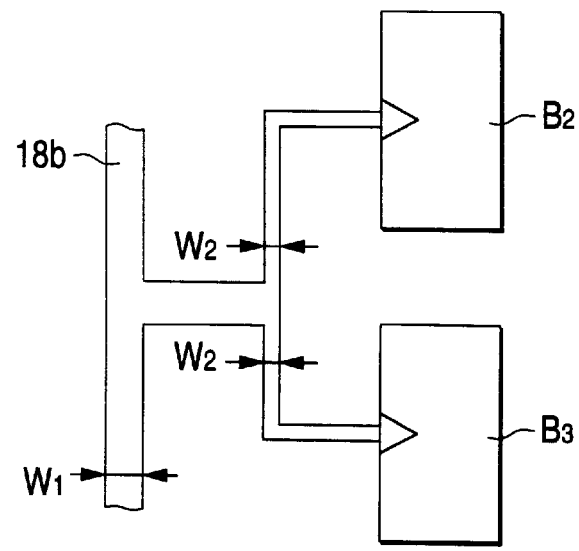
FIG. 2 is a plan view showing part of FIG. 1 in enlarged form.

FIG. 1 is an exemplary clock wiring of the invention; and FIG. 2 shows part of FIG. 1 in enlarged form.

Figure 3:
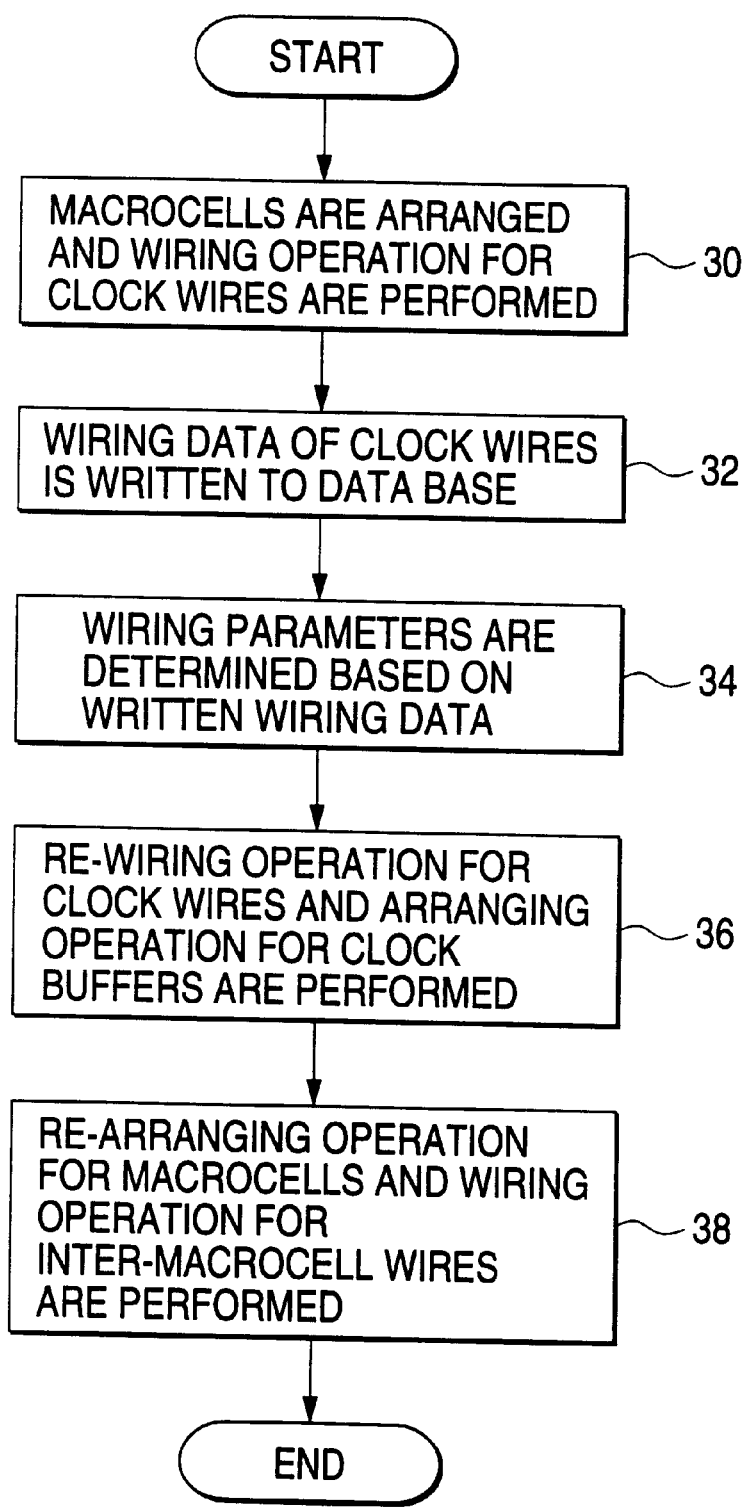
FIG. 3 is a flowchart showing an example in which how arranging/wiring operation is performed.
Figure 4:
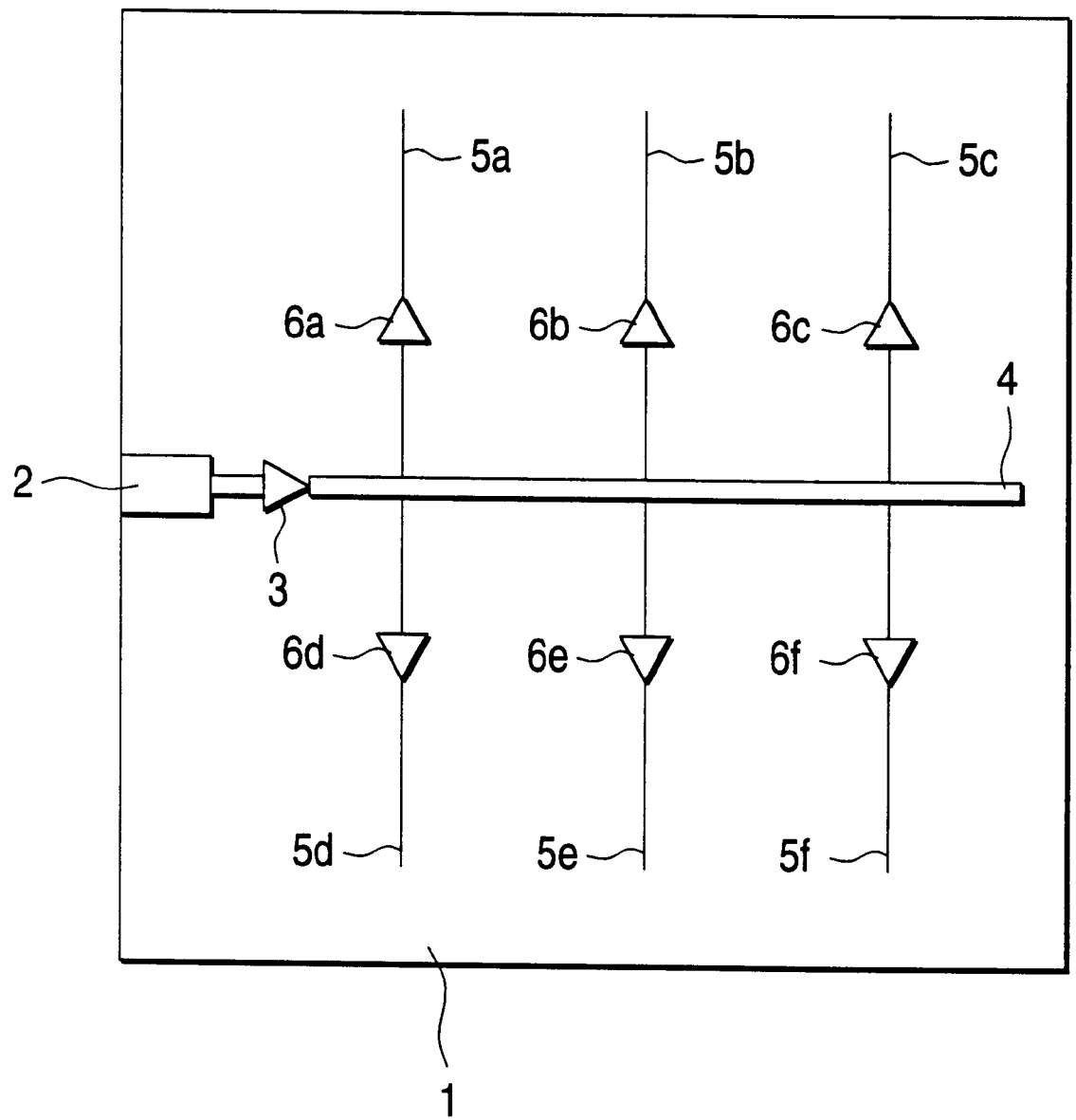
FIG. 4 is a plan view showing a conventional wiring condition of clock wires.

FIG. 3 shows a preferred arranging/wiring operation for carrying out the invention using a gate array type automatic arranging/wiring system. A clock wiring design method of FIGS. 1 and 2 will be described with reference to FIG. 3.

In Step 30, required macrocells that constitute a desired integrated circuit are read from a library in which a group of macrocells including macrocells which are sequence circuits such as flip-flop circuits are registered, and such read macrocells are arranged in a region corresponding to a surface of a semiconductor chip. In FIG. 1, the thus arranged macrocells $A_1$, $A_2$, $B_1$ to $B_3$, $C_1$, $C_2$, which are sequence circuits, are shown for a semiconductor chip 10. Then, only the wiring operation for clock wires 16, 18a to 18c is performed in the region where the macrocells have been arranged so as to match the sequence circuit macrocells (a clock driver 12 and clock buffers 14, 20a to 20c are not arranged). The arranging operation for the macrocells and the wiring operation for the clock wires in Step 30 are performed using an automatic wiring tool.

Then, in Step 32, the wiring data of the clock wires is written to a database. Then, in Step 34, wiring parameters such as the width (e.g., $W_1$, $W_2$ shown in FIG. 2) and route of the clock wires 16, 18a to 18c and the connecting position of the clock buffers 14, 20a to 20c are determined based on the written wiring data. The clock wire 16 serves as a main line and the clock wires 18a, to 18c serve as branch lines.

Then, in Step 36, the re-wiring operation for the clock wires 16, 18a to 18c and the arranging operation for the clock driver 12 and the clock buffers 14, 20a to 20c are performed in accordance with the wiring parameters determined in Step 34.

In Step 38, the re-arranging operation for the macrocells and the wiring operation for inter-macrocell wires other than the clock wires are thereafter performed. The macrocell re-arranging operation is performed considering not only how the clock wires have been wired but also how the clock buffers and the like have been arranged. This operation may, in some cases, be omitted.

As a result of the series of operations described above, the clock wiring such as shown in FIGS. 1 and 2 can be obtained. In an area Q where sequence circuit macrocells concentrate, an optimal wiring design can be implemented by increasing the number of clock wires and clock buffers as well as increasing the clock wiring width.

The invention is not limited to the aforementioned embodiment, but may be embodied in various other modifications. For example, the invention is applicable to standard cell type methods in addition to the gate array type method.

As described in the foregoing, the invention is characterized as re-wiring the clock wires and arranging the clock buffers by determining the wiring parameters based on the wiring data of the clock wires. Therefore, a wiring design suited for a specific sequence circuit cell arrangement can be implemented, which in turn provides the advantage of eliminating such shortcomings as insufficient wiring width, waste of clock wires and clock buffers, and clock skews.

What is claimed is:

1. A clock wiring design method for an integrated circuit comprising the steps of:

reading circuit cells necessary for forming a desired integrated circuit from a library in which a group of circuit cells including sequence circuit cells are registered and arranging the read circuit cells in a region corresponding to a surface of a semiconductor chip;

performing a wiring operation for the circuit cells arranged in the region;

determining wiring parameters for clock wires and clock buffers based on wiring data of the clock wires including data indicative of the relative concentration of sequence circuit cells in the integrated circuit, the wiring parameters include clock wire width and route and clock buffer connection positions; and performing a re-wiring operation for the clock wires and an arranging operation for the clock buffers in accordance with the wiring parameters determined in the preceding step.

2. The clock wiring design method of claim 1, further comprising a step of writing said wiring data of the clock wires to a database after said wiring operation performing step.

3. The clock wiring design method of claim 1 or 2, further comprising a step of performing a re-arranging operation for the circuit cells and a wiring operation for inter-circuit-cell wires other than the clock wires after said step of performing a re-wiring operation for the clock wires.

4. The clock wiring design method of claim 1, wherein the clock wiring design is applied to gate array type method.

5. The clock wiring design method of claim 1, wherein the clock wiring design is applied to standard cell type methods.

6. The clock wiring design method of claim 1, wherein in the determining step, the wiring parameters are determined so that in regions of the integrated circuit where sequence circuit cells are relatively concentrated, at least one of the following is increased: the number of clock wires, the number of clock buffers, and the clock wiring width.

7. The clock wiring design method of claim 3, wherein the re-arranging operation for the circuit cells and the wiring operation for inter-circuit-cell wired other than the clock wired are performed taking into consideration the wiring of the clock wires and the arrangement of the clock buffers.

* * * * *